US008669750B2

(12) United States Patent
Apriletti et al.

(10) Patent No.: US 8,669,750 B2
(45) Date of Patent: Mar. 11, 2014

(54) METHOD OF FORMING A SEMICONDUCTOR DEVICE AND STRUCTURE THEREOF

(75) Inventors: David Apriletti, Johnston, RI (US); Robert H. Fugere, North Providence, RI (US); Justin Larson, Providence, RI (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 387 days.

(21) Appl. No.: 13/024,721

(22) Filed: Feb. 10, 2011

(65) Prior Publication Data

US 2012/0206125 A1    Aug. 16, 2012

(51) Int. Cl.
*G05F 1/00*    (2006.01)
(52) U.S. Cl.
USPC ........................................................ 323/282
(58) Field of Classification Search
USPC .................... 323/282–285, 288; 363/147
See application file for complete search history.

(56) References Cited

U.S. PATENT DOCUMENTS 6,963,498 B2 * 11/2005 Nadd .............................. 363/98
2009/0108908 A1 * 4/2009 Yamadaya .................... 327/390

OTHER PUBLICATIONS

ON Semiconductor Data Sheet "NCV7510 Flexmos(TM) Programmable Peak and Hold PWM MOSFET Predriver", Copyright Semiconductor Components Industries, LLC 2005, Jan. 2005—Rev. 0, 22 pages.

* cited by examiner

*Primary Examiner* — Jue Zhang
(74) *Attorney, Agent, or Firm* — Robert F. Hightower

(57) ABSTRACT

A power conversion circuit and method of formation is provided, which in one embodiment includes a transistor, a driver circuit having an output connected to a control electrode of the transistor and having a bootstrap port configured to be connected to a first terminal of a capacitor; a switch circuit having a first port connected to a current carrying electrode of the transistor and having a ground port connected to a ground, a capacitor port configured to be connected to a second of the capacitor, a first switch configuration in which the capacitor port is connected to the first port, and a second switch configuration in which the capacitor port is connected to the ground port.

20 Claims, 3 Drawing Sheets

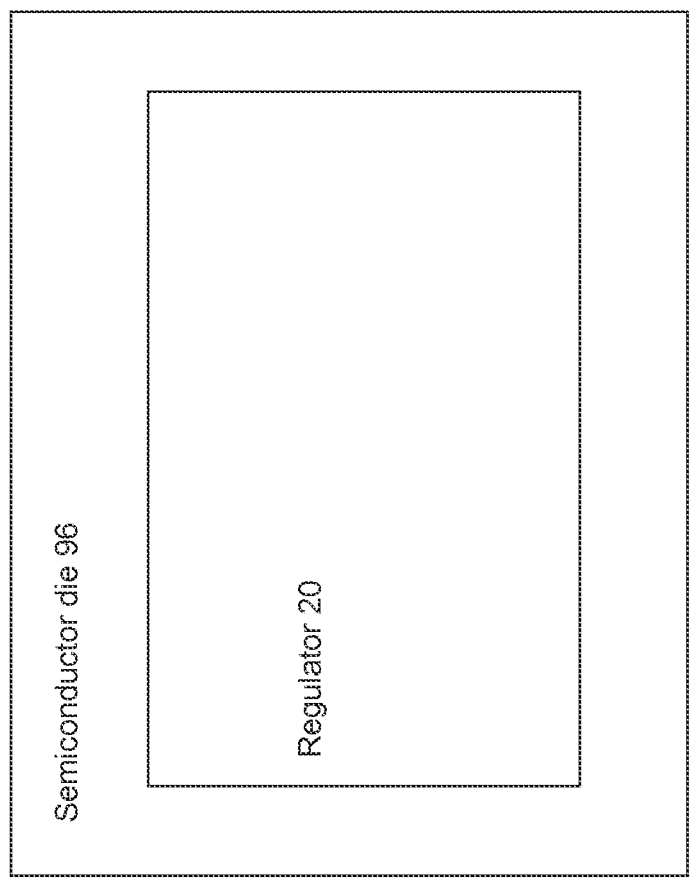

METHOD OF FORMING A SEMICONDUCTOR DEVICE AND STRUCTURE THEREOF

BACKGROUND OF THE INVENTION

The present invention relates, in general, to electronics, and more particularly to semiconductors, structures thereof, and methods of forming semiconductor devices.

In load switching applications (e.g., high-side switch configurations), it is sometimes desirable to employ metal oxide semiconductor field-effect transistor (NMOS) power transistor as the switch. In applications where one hundred percent duty cycle is not required, a bootstrap circuit that includes a bootstrap capacitor provides the desired gate overdrive voltage to the NMOS transistor has been used.

However, in certain applications it may be desirable to reduce the load or interrupt the load, which may prevent the bootstrap capacitor from being pre-charged. Accordingly, it is desirable to have a method of forming a load switch and a structure that allows pre-charging of the bootstrap circuit even when the load is reduced or interrupted. Additionally, it may be beneficial for the structure to be economically manufactured and to be easily integrated into preexisting circuit designs.

DETAILED DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and implementations or embodiments shown. In the drawings:

FIG. 3 illustrates an enlarged plan view of a semiconductor device that includes the circuit of FIG. 2 in accordance with an example embodiment of the present invention.

Figure 1:
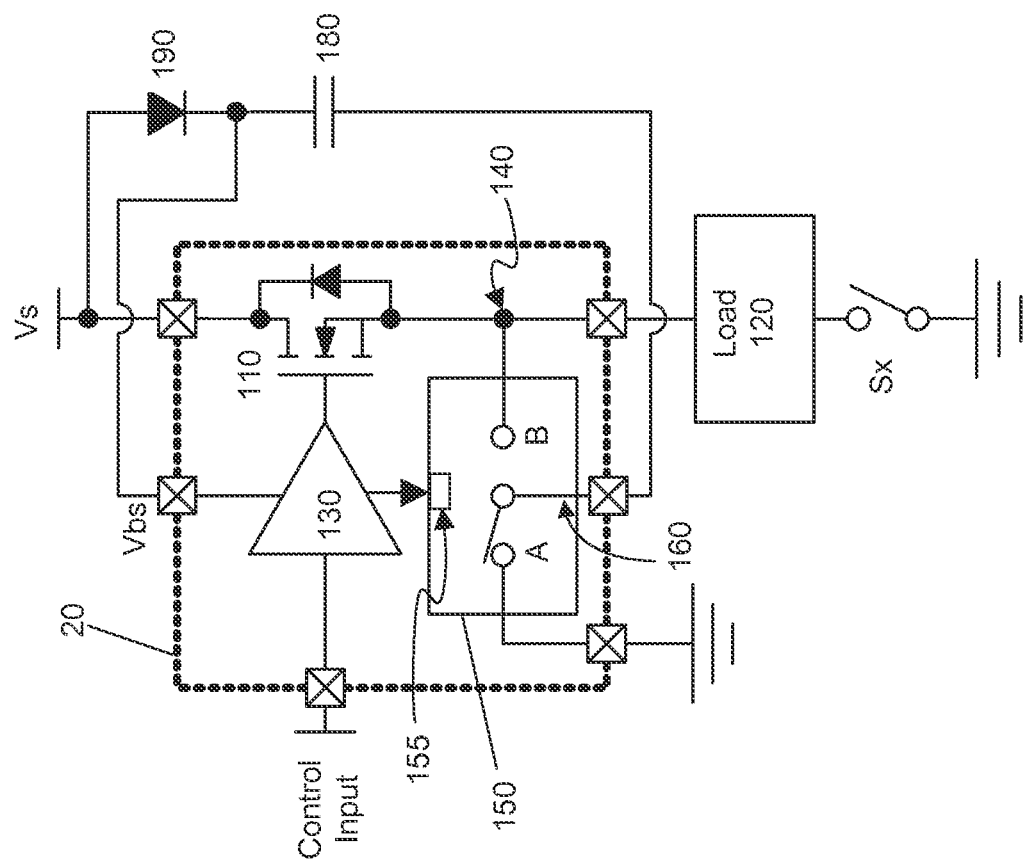
FIG. 1 is a block diagram of a circuit in accordance with an example embodiment of the present invention.

For simplicity and clarity of the illustration, elements in the figures are not necessarily to scale, are only schematic and are non-limiting, and the same reference numbers in different figures denote the same elements, unless stated otherwise. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible. It will be appreciated by those skilled in the art that the words "during", "while", and "when" as used herein relating to circuit operation are not exact terms that mean an action takes place instantly upon an initiating action but that there may be some small but reasonable delay, such as a propagation delay, between the reaction that is initiated by the initial action. Additionally, the term "while" means that a certain action occurs at least within some portion of a duration of the initiating action. The use of the word "approximately" or "substantially" means that a value of an element has a parameter that is expected to be close to a stated value or position. However, as is well known in the art there are always minor variances that may prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and inactive means an inactive state of the signal. The actual voltage value or logic state (such as a "1" or a "0") of the signal depends on whether positive or negative logic is used. Thus, "asserted" can be either a high voltage or a high logic or a low voltage or low logic depending on whether positive or negative logic is used and "negated" may be either a low voltage or low state or a high voltage or high logic depending on whether positive or negative logic is used. Herein, a positive logic convention is used, but those skilled in the art understand that a negative logic convention could also be used. The terms "first", "second", "third" and the like in the Claims or/and in the Detailed Description of the Drawings, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

In the following description, for purposes of explanation and not limitation, specific details are set forth, such as particular signals, circuits, circuit arrangements, thresholds, components, operation modes, techniques, protocols, hardware arrangements, either internal or external, etc., in order to provide a thorough understanding of the present invention.

However, it will be apparent to one skilled in the art that the present invention may be practiced in other embodiments that depart from these specific details, Detailed descriptions of well-known signals, circuits, thresholds, components, operation modes, techniques, protocols, and hardware arrangements, either internal or external, etc., are omitted so as not to obscure the description.

NMOS transistors often need a gate overdrive voltage that is higher than the source voltage in order to saturate the transistor and thus avoid significant conduction and switching losses. A bootstrap capacitor may be used to provide the needed overdrive voltage. Once the turn on charge and/or overdrive voltage has been delivered to the gate of the NMOS transistor, a minimum gate charge is maintained throughout the desired turn-on period.

FIG. 1 illustrates an example embodiment of the present invention having a load switch with an alternate means of pre-charging a bootstrap capacitor when the load is not connected or is reduced. The method of pre-charging the bootstrap capacitor may vary via use of a switch circuit that can connect the bootstrap capacitor to a switch node (connected to a load) when the load is connected or connect the bootstrap capacitor to an alternate path (e.g., to ground) when the bad is not connected. As illustrated, the circuit includes power transistor 110 that controls the flow of current to the bad 120 from the source Vs. The control electrode (gate) of the transistor 110, which in this embodiment comprises an NMOS transistor, receives an input from gate driver 130, which may receive one or more control signals as an internal or external input (i.e., from Control Input). The control signal may comprise a pulsewidth modulated signal. The gate driver 130 also receives an input from bootstrap terminal Vbs configured to be connected to a first terminal of bootstrap capacitor 180, which is used to provide the desired gate overdrive voltage to the transistor 110. The gate driver 130 may be integrated on the same or different substrate as transistor 110.

This example embodiment includes a switch 150 having g four ports. Specifically, the switch 150 in the example embodiment has a first port (e.g. a ground port) connected to ground via position "A" and a second port connected to switch node 140 via position "B", to which the load 120 and the output of the power transistor 110 are also connected. The switch 150 also includes a control port 155 that in this example embodiment receives a control input from the gate driver 130. Finally, the switch 150 includes a capacitor port 160 that is configured to be connected to a bootstrap capacitor 180. Capacitor 180 could be either an integrated or an external component.

In this example embodiment, the switch 150 has a first configuration in which capacitor port 160 is electrically connected to ground. This first configuration is indicated as position A in FIG. 1. The switch 150 has a second configuration in which the capacitor port 160 is connected to switch node 140 and therefore also connected to the load 120 and the output of the power transistor 110. This second configuration is indicated as position B in FIG. 1.

It is worth noting that the dashed square 20, in this example embodiment, represents a load switching power arrangement, for example, a voltage regulation arrangement, and therefore includes components that may be incorporated into the semiconductor device, and the surrounding components (e.g., bootstrap capacitor 180, diode 190, load 120, and switch Sx) may be added by the circuit designer and could therefore be external to the semiconductor device in this example embodiment. In other embodiments, fewer or more components may be incorporated into the semiconductor device.

During operation a control input activates the gate driver 130 and supplies charge from the bootstrap capacitor 180 to the transistor 110 to turn the transistor 110 on. The control input may be a pulsewidth modulated signal in order to periodically recharge the bootstrap capacitor 180 as the capacitor's charge is consumed by the gate driver 130. The bootstrap capacitor 180 may be charged via one of two paths that correspond to the two configurations of the switch 150. Specifically, when the load is not interrupted (i.e., when switch Sx is closed connecting the load to ground), the switch 150 is put in position B so that the bootstrap capacitor 180 is pre-charged from Vs through diode 190, the switch 150 (in position B), the load 120, and through switch Sx to ground. When the load is interrupted (i.e., when switch Sx is open, disconnecting the load from ground), the switch 150 is put in position A so that the bootstrap capacitor 180 is pre-charged from Vs through diode D1, and the switch 150 (in position A) to ground. The control port 155 in this example embodiment receives inputs from the gate driver 130 although appropriate control signals from any suitable source may be used. In one example embodiment, the control input to the control port 155 may be received from (or controlled by) an internal or external processor that either controls the load switch Sx, that can determine the configuration of the load switch Sx, or that can determine the magnitude of the load.

If the bootstrap capacitor 180 was directly connected to the load 120 without the switch 150 (i.e., a circuit equivalent to the switch 150 being in position B), when the load 120 is not connected to ground (i.e., the switch Sx open) the bootstrap capacitor 180 could not charge sufficiently, which may result in a delay in the startup of transistor 110 thereby resulting in an insufficient output current demand from transistor 110.

Figure 2:
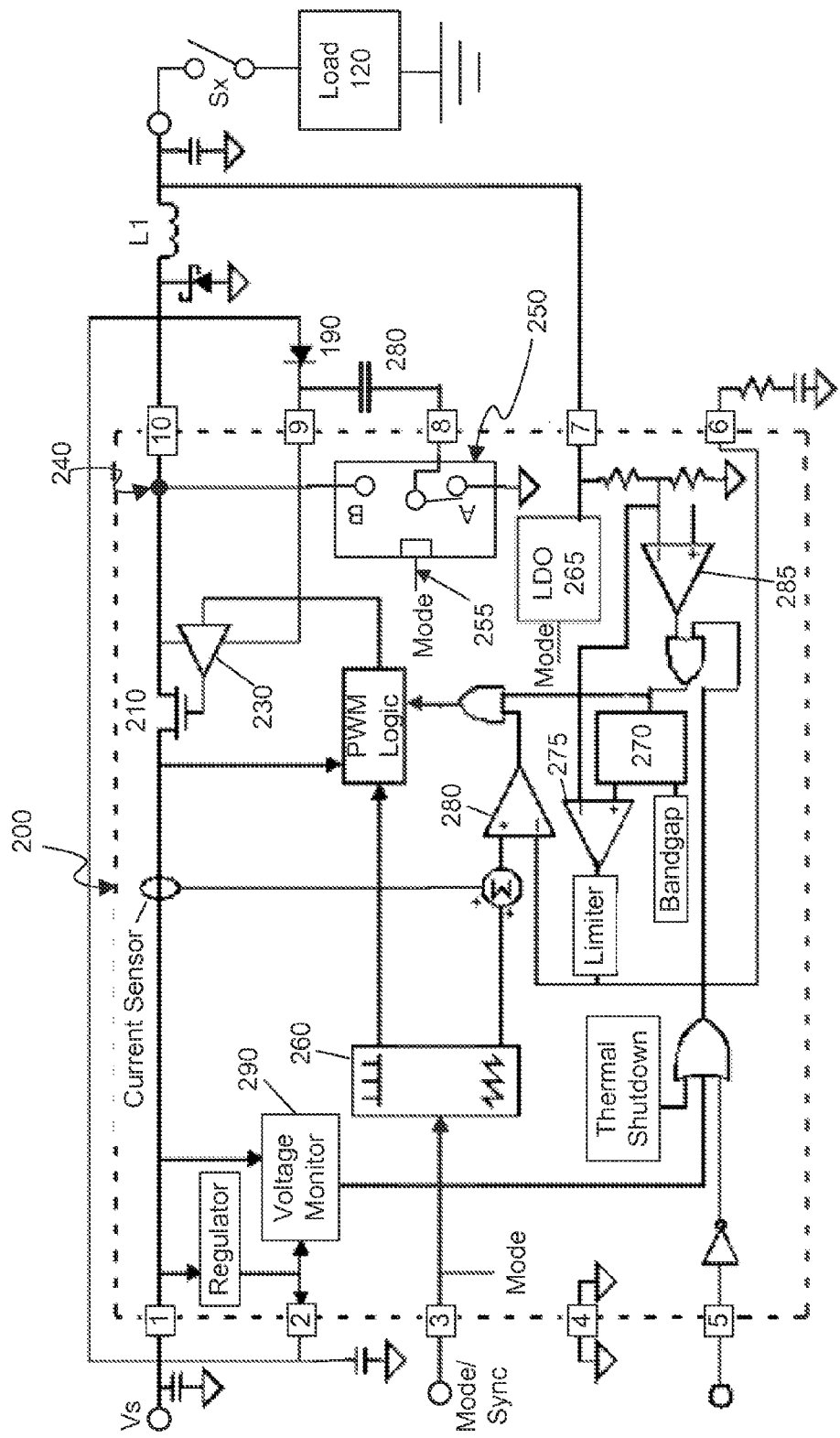
FIG. 2 is a block diagram of another circuit in accordance with an example embodiment of the present invention.

FIG. 2 illustrates another example embodiment of the present invention that comprises a dual-mode regulator that operates either as a pulsewidth modulation (PWM) buck converter in one operational mode or as a low drop out linear regulator in a second operational mode. This example embodiment is intended to receive a direct current (DC) supply voltage input to Vs within a wide operating range and to provide a known regulated output voltage. This example embodiment includes a transistor 210, such as an NMOS transistor, that operates as a switch with a first current carrying electrode connected to the voltage source Vs and a second current carrying electrode connected to the load 120 via inductor L1. Gate driver 230 may be connected to the control electrode (gate) of the transistor 210 to control the operation of the transistor 210 via any of various suitable regulation control schemes known to those skilled in the art.

The switch 250 of FIG. 2 has a first port connected to switch node 240 (terminal B) and a ground port connected to ground (terminal A). The first port is therefore connected to the output of transistor 210 and to the load 120 (when connected). The switch 250 also includes a control port 255 that receives a control input to control the configuration of the switch 250. Finally, the switch 250 includes a capacitor port that is connected to port 8 of the semiconductor device 200, which is configured to be connected to an external bootstrap capacitor 280. The semiconductor device 200 also includes a bootstrap port (port 9) that is connected to the gate driver 230 and configured to be connected to the other terminal of the bootstrap capacitor 280 as shown.

In this example embodiment, the switch 250 has a first configuration in which the capacitor port, which is connected to semiconductor port 8, is electrically connected to ground. This first configuration is indicated as position A in FIG. 2. The switch 250 has a second configuration in which the capacitor port is connected to the switch node 240 and therefore also connected to the load 120 (if connected) and the output of the power transistor 210. This second configuration is indicated as position B in FIG. 2.

The control port 255 of the switch 250 is connected to the Mode/Sync port (port 3) of the semiconductor device 200 through appropriate logic which detects and responds to, for example, the Mode/Sync port going to appropriate state(s) for a predetermined time period (e.g., three dock cycles When the Mode/Sync port signals meet any pre-determined requirements (e.g., time out low), the low drop out (LDO) circuit 265 activates, and the mode control causes the switch 250 to the first configuration (position A) so that the bootstrap capacitor 280 is connected to ground via the switch 250. Otherwise the LDO circuit 265 is in standby and the switch 250 is put in the second configuration (position B) so that the bootstrap capacitor 280 is connected to the switch node 240 so that the bootstrap capacitor 250 is charged through the load 120.

During operation, a control input from the Mode/Sync port is supplied to the oscillator 260, whose output is supplied to the PWM logic circuit that activates the gate driver 230, which routes charge from the bootstrap capacitor 280 to the transistor 210. The bootstrap capacitor 280 may be charged via one of two paths that correspond to the two configurations of the switch 250. Specifically, when the load is not interrupted (i.e., when switch Sx is closed allowing charging through the load to ground), the switch 250 is put in the second configuration (position B) so that the bootstrap capacitor 280 is pre-charged from Vs through diode 190, the switch 250 (in position B), inductor L1, and the load 120 to ground. When the load 120 is interrupted (i.e., when switch Sx is open, preventing charging through the load to ground), the switch 250 is placed in the first configuration (position A) so that the bootstrap capacitor 280 is pre-charged from Vs through diode 190, and the switch 250 (in position A) to ground. In one example embodiment, the input to the Mode/Sync port is received from (or controlled by) an external processor that either controls the load switch Sx, that can determine the configuration of the load switch Sx, or that can determine the magnitude of the load.

If the bootstrap capacitor 280 was directly connected to the load 120 load without the switch 250 (i.e., a circuit equivalent to the switch 250 being in position B), when the load 120 is not connected to ground the bootstrap capacitor 280 could not charge sufficiently, which would result in a delay in the startup of transistor 210 thereby resulting in an insufficient output current demand from transistor 210.

With explanation of the alternate bootstrap switching circuit complete, a brief overview of the remainder of the circuitry will be provided although operation of said circuitry will be evident to one skilled in the art from the schematic of FIG. 2. It will be evident to one skilled in the art that the present invention is not intended to be limited to the embodiment of FIG. 2 or any specific embodiment disclosed herein. The device 200 of FIG. 2 may operate in either of two modes—a PWM switching converter or as a low drop out linear regulator. The input voltage source is connected to port 1 of the semiconductor 200. Port 2 of the semiconductor 200 provides a regulated output voltage through the diode 190 to the bootstrap capacitor 280 and gate driver 230. Port 3 of the semiconductor 200 is ode selection input and a synchronization input. A falling edge input is used to synchronize the internal oscillator. As discussed previously, the device 200 is transitioned to low drop out (LDO) mode when the mode/sync port (port 3) is in a first predetermined state (e.g., low) for a predetermined time period, and is in switching converter regulation mode when port 3 in a s second state (e.g., high). Port 4 is a ground port and port 5 of the device 200 comprises an enable pin, which when in an appropriate state (e.g., grounded) prevents the transistor 210 from switching and reduces quiescent current draw.

Port 6 of the semiconductor device 200 receives an output from error amplifier 275 for tailoring transient response with external compensation components. The output voltage of the error amplifier 275 controls the peak inductor current at which the switch transistor 210 shuts off. The output from the error amplifier 275 is also provided to PWM comparator 280, whose output is supplied to the PWM logic circuit (whose output drives gate driver 230). Port 7 of the semiconductor device 200 is connected to LDO circuit 265 (to provide an LDO output) and to comparator 285 to provide output voltage feedback (i.e., used for regulation of the output voltage as well as LDO output in LDO mode). The output of the comparator 285 is supplied to soft-start circuit 270. Upon being enabled or released from a fault condition, and after the drive voltage is established at port 2, the soft-start circuit 270 ramps the reference voltage to the switching regulator error amplifier 280 to the final value. During a soft start, frequency foldback occurs until the output voltage approaches regulation. The voltage monitor circuit 290 monitors the input voltage and if an undervoltage occurs the circuit 290 outputs a signal to inhibit switching of the transistor 210 and to initiate a soft-start. The thermal shutdown circuit may also inhibit switching and reset the soft-start circuit 270. As discussed, port 8 of the semiconductor device 200 is to be connected to a bootstrap capacitor 280 and port 9 is configured to be connected to the other terminal of the bootstrap capacitor 280 and to a diode 190. Finally, port 10 provides the regulated output and is connected to the switch node 240 and therefore the output of the transistor 230 and switch 250.

It is worth noting that the dashed rectangle 200, in this example embodiment, includes components that may to be incorporated onto one semiconductor device and the surrounding components (e.g., bootstrap capacitor 280, diode 190, load 120, and switch Sx) may be added by the circuit designer and are external to the semiconductor device in this example embodiment. In other embodiments, fewer or additional components may be incorporated into the semiconductor device.

FIG. 3 illustrates an enlarged plan view of a portion of an embodiment of a regulator formed on semiconductor die 96. Semiconductor die 96 may also include other circuits that are not shown in FIG. 3 for simplicity of the drawing. Regulator 20 may be formed on die 96 by semiconductor manufacturing techniques that are well known to those skilled in the art. In one embodiment, regulator 20 is formed on a semiconductor substrate as an integrated circuit having ten external leads 1-10.

While the subject matter of the invention is described with specific example embodiments, the foregoing drawings and descriptions thereof depict only typical embodiments of the subject matter and are not therefore to be considered to be limiting of its scope, it is evident that many alternatives and variations will be apparent to those skilled in the art. For example, the subject matter has been described for a particular NMOS transistor using a bootstrap capacitor, although the invention is directly applicable to other devices that may use bootstrap capacitors such as for example, NPN transistors, insulated gate bipolar transistors (IGBT), HFETs, and/or other switches (e.g., transistors) that require a positive voltage to turn on. While the example embodiments of the present invention have be described in the context of voltage regulators, the present invention may be implemented in other power conversion circuits such as, for example, power inverters. While the example embodiments of the present invention have be described in the context of buck converters, the present invention may be implemented in other circuit topologies as well.

From the foregoing one skilled in the art can determine that according to one embodiment, a power conversion circuit for providing a regulated output is provided, comprising an transistor having a gate, a first current carrying electrode and second current carrying electrode; wherein said first current carrying electrode of said transistor is configured to be connected to a voltage source; wherein said second current carrying electrode of said transistor is configured to be connected to a load; a gate driver circuit having an output connected to said gate of said transistor; said gate driver circuit having a bootstrap port; a switch circuit having a first port connected to said second current carrying electrode of said transistor; said switch circuit having a ground port configured to be connected to a ground; said switch circuit having a control port and a capacitor port; said switch circuit having a first configuration in which said capacitor port is connected to said first port; said switch circuit having a second configuration in which said capacitor port is to said ground port; wherein said switch circuit is responsive to a control signal received at said control port to transition between said first configuration and said second configuration; wherein said capacitor port of said switch circuit is configured to be connected to a first terminal of a capacitor; and wherein said bootstrap port of said gate driver circuit is configured to be connected to a second terminal of the capacitor. The circuit may include a pulsewidth modulation (PWM) circuit having an output connected to the control input of the gate driver circuit.

Those skilled in the art will also appreciate that according to another embodiment, a power conversion circuit is provided that comprises a transistor having a control electrode, a first current carrying electrode configured to be connected to a voltage source, and a second current carrying electrode connected to a switch node; a driver circuit having an output connected said control electrode of said transistor; said driver circuit having a bootstrap port and a control input for receiving a control signal; a switch circuit having a first port connected to said switch node; said switch circuit having a ground port configured to be connected to a ground; said switch circuit having a capacitor port; said switch circuit having a first configuration in which said capacitor port is connected to said first port; said switch having a second configuration in which said capacitor port is connected to said ground port; and said switch having control port configured to cause said switch circuit to transition between said first configuration and said second configuration in response to receiving one or more control signals. In addition, the bootstrap port may be configured to be connected to a first terminal of a capacitor; and the capacitor port configured to be connected to a second terminal of the capacitor.

Those skilled in the art will also appreciate that according to yet another embodiment, a method of forming a semiconductor device for providing a regulated output may comprise providing a transistor having a control electrode, a first current carrying electrode configured to be connected to a voltage source, and a second current carrying electrode connected to a switch node; connecting an output of a driver circuit to the control electrode of the transistor; connecting a bootstrap port of the driver circuit to a first semiconductor port; providing a switch comprising: a first port connected to the switch node; a ground port connected to a ground; a capacitor port; and a control port; configuring the switch to have a first state in which said capacitor port is connected to said first port; configuring the switch to have a second state in which said capacitor port is connected to said ground port; and configuring said switch to transition between the first configuration and the second configuration in response to receiving one or more control signals at the control port. The method may further comprise connecting an output of a pulsewidth modulation (PWM) to a control input of the driver circuit, and wherein the first semiconductor port is configured to be connected to a first terminal of a capacitor; and wherein the capacitor port is configured to be connected to a second terminal of the capacitor.

In view of all of the above, it is evident that a novel device and method is disclosed. Included, among other features, is a load switch having an alternate means of pre-charging a bootstrap capacitor when the load is not connected or reduced. In addition, the method of pre-charging the bootstrap capacitor may vary via use of a switch circuit that can connect a bootstrap capacitor to a switch node (connected to a load) when the load is connected or connect the bootstrap capacitor to an alternate node (for connection to ground) when the load is not connected.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention.

As the claims hereinafter reflect, inventive aspects may lie in less than all features of a single foregoing disclosed embodiment. Thus, the hereinafter expressed claims are hereby expressly incorporated into this Detailed Description of the Drawings, with each cairn standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A power conversion circuit for providing a regulated output, comprising:
    a transistor having a gate, a first current carrying electrode and second current carrying electrode;
    wherein said first current carrying electrode of said transistor is configured to be connected to a voltage source;
    wherein said second current carrying electrode of said transistor is configured to be connected to a load;
    a gate driver circuit having an output connected to said gate of said transistor;
    said gate driver circuit having a bootstrap port;
    a switch circuit having a first port connected to said second current carrying electrode of said transistor;
    said switch circuit having a ground port configured to be connected to a ground;
    said switch circuit having a control port and a capacitor port;
    said switch circuit having a first configuration in which said capacitor port is connected to said first port;
    said switch circuit having a second configuration in which said capacitor port is connected to said ground port responsively to the load being interrupted;
    wherein said switch circuit is responsive to a control signal received at said control port to transition between said first configuration and said second configuration;
    wherein said capacitor port of said switch circuit is configured to be connected to a first terminal of a capacitor; and
    wherein said bootstrap port of said gate driver circuit is configured to be connected to a second terminal of the capacitor.

2. The power conversion circuit according to claim 1, which is implemented as a semiconductor device and further comprises a pulsewidth modulation (PWM) circuit having an output connected to a control input of said gate driver circuit.

3. The power conversion circuit according to claim 1, which is implemented as a semiconductor device configured to receive a control signal for controlling said switch circuit from an external device.

4. A power conversion circuit, comprising:
a transistor having a control electrode, a first current carrying electrode configured to be connected to a voltage source, and a second current carrying electrode connected to a switch node;
a driver circuit having an output connected said control electrode of said transistor;
said driver circuit having a bootstrap port and a control input for receiving a control signal;
a switch circuit having a first port connected to said switch node;
said switch circuit having a ground port configured to be connected to a ground;
said switch circuit having a capacitor port;
said switch circuit having a first configuration in which said capacitor port is connected to said first port;
said switch having a second configuration in which said capacitor port is connected to said ground port responsively to the load being interrupted; and
said switch having control port configured to cause said switch circuit to transition between said first configuration and said second configuration in response to receiving one or more control signals.

5. The power conversion circuit according to claim 4, wherein said transistor comprises a N-channel field-effect transistor.

6. The power conversion circuit according to claim 4, wherein said bootstrap port is configured to be connected to a first terminal of a capacitor; and
wherein said capacitor port is configured to be connected to a second terminal of the capacitor.

7. The power conversion circuit according to claim 6, wherein said bootstrap port is further configured to be connected to a diode.

8. The power conversion circuit according to claim 4, which is implemented as a semiconductor device and further comprises a pulsewidth modulation (PWM) circuit having an output connected to said control input of said driver circuit.

9. The power conversion circuit according to claim 4, wherein said switch node is configured to be connected to a load.

10. The power conversion circuit according to claim 4, which is implemented as a semiconductor device configured to receive a control signal for controlling said switch circuit from an external device that has access to information of a magnitude of a load connected to said switch node.

11. The power conversion circuit according claim 4, wherein said control port of said switch circuit is connected to said driver circuit.

12. The power conversion circuit according claim 4, wherein said control port of said switch is configured to receive an input derived from a source external to the power conversion circuit.

13. A method of forming a semiconductor device for providing a regulated output, comprising:
providing a transistor having a control electrode, a first current carrying electrode configured to be connected to a voltage source, and a second current carrying electrode connected to a switch node;
connecting an output of a driver circuit to the control electrode of the transistor;
connecting a bootstrap port of the driver circuit to a first semiconductor port;
providing a switch comprising:
a first port connected to the switch node;
a ground port connected to a ground;
a capacitor port; and
a control port;
configuring the switch to have a first state in which said capacitor port is connected to said first port;
configuring the switch to have a second state in which said capacitor port is connected to said ground port responsively to one of the load being interrupted or a mode signal having a certain state for more than three cycles of a clock of the semiconductor device; and
configuring said switch to transition between the first configuration and the second configuration in response to receiving one or more control signals at the control port.

14. The method according to claim 13, wherein said transistor comprises a N-channel field-effect transistor.

15. The method according to claim 13, wherein the first semiconductor port is configured to be connected to a first terminal of a capacitor; and
wherein the capacitor port of the switch is connected to second semiconductor port that is configured to be connected to a second terminal of the capacitor.

16. The method of claim 15, wherein the first semiconductor port is further configured to be connected to a diode.

17. The method according to claim 13, further comprising connecting an output of a pulsewidth modulation (PWM) to a control input of the driver circuit.

18. The method according to claim 13, wherein the semiconductor device is configured to receive a control signal for controlling the switch from an external device that has access to information of a magnitude of a load connected to the switch node.

19. The method according to claim 13, wherein the control port of said switch is connected to said driver circuit.

20. The method according to claim 13, wherein the control port of the switch is configured to receive an input derived from a source external from the semiconductor device.

* * * * *